United States Patent [19]

Takeuchi et al.

[11] 4,256,987

[45] Mar. 17, 1981

[54] CONSTANT CURRENT ELECTRICAL CIRCUIT FOR DRIVING PIEZOELECTRIC TRANSDUCER

[75] Inventors: Akihiro Takeuchi; Kiyokazu Asai, both of Nagoya, Japan

[73] Assignee: Kabushiki Kaisha Toyota Chuo Kenkyusho, Nagoya, Japan

[21] Appl. No.: 32,875

[22] Filed: Apr. 24, 1979

[30] Foreign Application Priority Data

Apr. 24, 1978 [JP] Japan ................................ 53-48548

[51] Int. Cl.³ ............................................ H01L 41/08

[52] U.S. Cl. .................................................... 310/316

[58] Field of Search ....................... 310/314, 316, 317; 239/102; 318/116

[56] References Cited

U.S. PATENT DOCUMENTS

| | | | |
|---|---|---|---|
| 3,443,130 | 5/1969 | Shoh | 310/316 |
| 3,526,792 | 9/1970 | Shoh | 310/316 |
| 4,156,157 | 5/1979 | Mabille | 310/316 |

*Primary Examiner*—Mark O. Budd
*Attorney, Agent, or Firm*—Oblon, Fisher, Spivak, McClelland & Maier

[57] ABSTRACT

An electrical circuit for driving a piezoelectric transducer includes a DC electric source, a constant current circuit, connected to the DC electric source for processing a DC signal from the DC electric source and supplying a constant output current having a predetermined constant value, and an oscillation circuit connected to the constant current circuit for driving the piezoelectric transducer with a resonance frequency and with a constant current. The electrical circuit approximately drives the piezoelectric transducer with a constant current by supplying the constant current to the oscillation circuit.

15 Claims, 11 Drawing Figures

CONSTANT CURRENT ELECTRICAL CIRCUIT FOR DRIVING PIEZOELECTRIC TRANSDUCER

BACKGROUND OF THE INVENTION

1. Field of the Invention

This invention relates to an electrical circuit for driving a piezoelectric transducer which drives an ultrasonic wave generating device employing a piezoelectric transducer as an electro-mechanical conversion element at a frequency equal to or near the natural resonance frequency thereof.

2. Description of the Prior Art

As ultrasonic wave generating devices have been extensively employed in various industrial fields recently, the development and study of the materials of electro-mechanical conversion elements and their manufacturing methods have been advanced, as a result of which electro-mechanical conversion elements having higher efficiency and capable of withstanding greater amplitudes than conventional ones are available. Accordingly, the ultrasonic wave generating device which had been bulky in view of its strength has been improved to be compact, and along with this improvement the oscillator for driving the ultrasonic wave generating device has been improved.

In the ultrasonic wave generating device, especially the piezoelectric transducer has been significantly improved so as to be compact. However, in the case where such a compact piezoelectric transducer is operated by ultrasonic energy, for instance in the case where the piezoelectric transducer is employed in a liquid atomizing device, the following difficulty is involved;

An ordinary piezoelectric transducer can be represented by an electrical equivalent circuits as shown in FIG. 1, which comprises a capacitance Cd as a capacitor independent of vibration, an inductance Lm and a capacitance Cm which are provided by the vibration of the piezoelectric transducer, and a load R in which energy is consumed as the loss in the transducer and the actual mechanical vibration output thereof. The natural resonance frequency of the electrical equivalent circuit is a frequency at which the absolute value of reactance in the inductance Lm is equal to the absolute value of reactance in the capacitance Cm. The transducer has the characteristic that when mechanical load is applied to the transducer vibrating at a frequency near the resonance frequency, the resistance component of the electrical equivalent circuit is varied, the resistance component R increasing with the load. If the piezoelectric transducer with this characteristic is driven with a constant voltage having a frequency equal to or near the resonance frequency, then electrical power inputted to the piezoelectric transducer is decreased with increasing load; that is, as the load is increased, the mechanical vibration output is decreased. This characteristic is disadvantageous in the case where it is required to maintain the mechanical vibration amplitude constant irrespective of the load variation. For instance, the following drawback can be pointed out: If, in an ultrasonic atomizing device employing the piezoelectric transducer as its ultrasonic atomizing vibrator, the piezoelectric transducer is driven with a constant voltage and the supply of a liquid to be atomized at the mechanical vibration output end, or the vibration surface thereof, is gradually increased, then the resistance component R of the piezoelectric transducer is increased, and therefore the electric power inputted to the piezoelectric transducer is decreased, as a result of which the mechanical vibration amplitude is reduced, and accordingly the capability is lowered, and at worst the atomization is not effected.

This non-atomization phenomenon is due to the formation of a thick liquid film on the atomizing surface of the vibrator by the interfacial tension of the liquid and the vibrator. In this case, the load as viewed from the vibrator is considerably great. In addition, the resistance component R as viewed from the terminal of the piezoelectric transducer is also considerably high. Even if the supply of the liquid is suspended, the thick liquid film is held as it is. An electrical input sufficient to atomize the liquid thus held is not applied to the piezoelectric transducer, and therefore it is considerably difficult to atomize the liquid again. In the case where the supply of liquid is decreased, the resistance component R is decreased, and therefore the greater electric power is applied to the piezoelectric transducer. As a result, the amplitude of the mechanical vibration of the piezoelectric transducer becomes great to the extent that it is unnecessary for atomization of the liquid. In the extremely worst case, cavitation is observed in the liquid supplied, thus splashing the supplied liquid directly and increasing the diameters of the atomized particles. Thus, the atomization is not carried out suitably. This is another drawback. Furthermore, since the transducer of the ultrasonic atomizing device is driven at its natural resonance frequency, the current supplied to the transducer is increased as the load is abruptly decreased and therefore the transducer is driven with an abnormally great amplitude. Accordingly, sometimes the transducer is broken. However, it is not practical to change the dimensions of the transducer to increase its strength, because it is necessary to vibrate the transducer at its natural resonance frequency and the resonance condition is disestablished if the dimensions are changed. Accordingly, in order to increase the strength to eliminate the above-described difficulty, it is necessary to selectively use materials in forming the transducer in view of the strength thereof. That is, it is required to use a material high in strength, and the degree of freedom in selecting the material is limited. This is another drawback.

In order to eliminate the above-described drawbacks, for the conventional device, a method is employed in which, as shown in FIG. 2, AC current driving the piezoelectric transducer is detected so that the driving AC current is maintained constant at all times irrespective of the load variation. More specifically, the conventional device comprises a DC electric source 1, an electric source control circuit 2, a voltage and power amplifier circuit 3 (hereinafter referred to merely as "a power amplifier circuit" 3), a piezoelectric transducer 4, a current detecting circuit 5, a DC conversion circuit 6, a voltage comparison circuit 7, and a reference voltage generating circuit 8.

In this conventional device, upon application of a suitable voltage from the DC electric source 1 through the electric source control circuit 2 to the power amplifier circuit 3, the output of the power amplifier circuit 3 drives the piezoelectric transducer 4. The AC current applied to the piezoelectric transducer 4 is detected by the current detecting circuit 5, and the detection signal is applied to the power amplifier circuit in a positive feedback mode. Thus, an oscillation circuit 9 is formed which oscillates at a frequency equal to or near the resonance frequency of the piezoelectric transducer 4. The output of the current detecting circuit 5 is applied to the DC conversion circuit 6, where a DC voltage proportional to the AC current in the piezoelectric transducer is obtained. This voltage is compared with a preset reference voltage outputted by the reference voltage generating circuit 8 in the voltage comparison circuit 7. The output of the comparison circuit 7 is employed to control the electric source control circuit 2 so that the electric source voltage to be applied to the power amplifier circuit 3 is varied to control the output of the power amplifier circuit 3, to permit alternate current corresponding to the preset output voltage provided by the reference voltage generating circuit 8 to flow in the piezoelectric transducer 4, and to drive the piezoelectric transducer 4 with a constant current.

In this connection, it is assumed that the piezoelectric transducer 4 is driven at a frequency equal to or near the natural resonance frequency and a suitable quantity of liquid is supplied to the mechanical output end thereof for atomization; that is, the transducer is operated in steady state. If, under this state, the supply of liquid is increased to increase the load of the piezoelectric trnasducer, then the resistance component R of the equivalent circuit shown in FIG. 1 is increased. However, in this conventional circuit, as the constant current is allowed to flow irrespective of the load variation, the greater electrical energy is supplied to the piezoelectric transducer, and therefore the problems that, when the supply of liquid is changed, the atomization is not effected or the diameters of particles obtained by the atomization are extremely increased can be avoided.

However, this conventional device is still disadvantageous in the following points: When the piezoelectric transducer is broken, or when the lead wires thereof are shorted and the output transistor of the power amplifier 3 is damaged, no current will flow in the piezoelectric transducer 4. Also, when the energy stored in the inductive impedance components of the circuits is discharged by the on-off operation and the transistor in the power amplifier 3 is secondarily damaged to cause a short-circuit trouble, no current will flow in the piezoelectric transducer 4. In these cases, the output of the DC conversion circuit 6 becomes zero and therefore the output of the voltage comparison circuit 7 acts on the electric source control circuit 2 to increase the output of the latter. However, as the value of the current in the piezoelectric transducer 4 is maintained unchanged, zero, the output current of the electric source control circuit 2 is increased more and more, thus damaging the electric source control circuit 2. In the conventional device shown in FIG. 2, a DC electric source and control section consisting of the DC electric source 1, the electric source control circuit 2, the voltage comparison circuit 7 and the reference voltage generating circuit 8, and a high frequency section consisting of the oscillation circuit 9 and the DC conversion unit 6 form a feedback loop, and are in close association with each other. Accordingly, it is difficult to make the design, adjustment and experiment of the conventional device with the two sections separated from each other.

Aside from the example shown in FIG. 2 the same stable atomization can be effected by providing an AC constant current circuit in the power amplifier circuit or between the power amplifier circuit and the piezoelecpitric transducer. However, this method is disadvantageous in that the control is effected after the direct current has been converted into a high frequency current, thus causing loss of electric power when compared with the case where the control section is provided in the DC electric source section, and therefore it is necessary to increase the output of the oscilllation circuit to a relatively high value, which leads to the use of expensive components and to an increase in collective electric power loss.

SUMMARY OF THE INVENTION

Accordingly, it is an object of the present invention to provide a simple and cheap electrical circuit for stably driving a piezoelectric transducer.

It is another object of the present invention to provide an electrical circuit for driving a piezoelectric transducer in which it is easy to make the design and adjustment.

It is a further object of the present invention to provide an electrical circuit for driving a piezoelectric transducer which approximately drives the piezoelectric transducer with a constant current by supplying said constant current to the oscillation circuit.

The electrical circuit for driving a piezoelectric transducer according to this invention comprises: a DC electric source; a constant current circuit connected to the DC electric source for processing a DC signal from the DC electric source and supplying a constant output current having a predetermined constant value; and an oscillation circuit connected to the constant current circuit for driving the piezoelectric transducer at a resonance frequency and with a constant current, thereby approximately driving the piezoelectric transducer with a constant current by supplying the constant current to the oscillation circuit.

The electrical circuit for driving a piezoelectric transducer according to the first aspect of the invention employs the constant current circuit which comprises an electrical element having predetermined electrical characteristics and which supplied the constant output current by utilizing the predetermined electrical characteristics of the electrical element.

The electrical circuit for driving a piezoelectric transducer according to the second aspect of this invention comprises: a DC electric source; a constant current circuit including a current detecting circuit for detecting current allowed to flow from the DC electric source to a load circuit, a reference voltage generating circuit for generating a reference voltage, a voltage comparison circuit for comparing an output voltage of the current detecting circuit with an output voltage of the reference voltage generating circuit, and a DC constant current control circuit for controlling the current allowed to flow in the load circuit with the aid of an output of the voltage comparison circuit; and an oscillation circuit for driving the piezoelectric transducer at a frequency equal to or near the natural resonance frequency thereof with the aid of a constant current provided by the constant current circuit and for causing the driving voltage thereof to approximately be proportional to an electric source voltage, the electric source current for the oscillator being made to be a constant current to subject the piezoelectric transducer to constant current drive in approximation mode.

The present invention provides an electrical circuit for driving a piezoelectric transducer in which the piezoelectric transducer is subjected to constant current drive in an approximation mode, so as to prevent the electric source and its control circuit from being damaged by the short of the piezoelectric transducer or other short-circuit troubles and to prevent the entire circuit from being completely damaged, and in order to achieve the circuit design and experiment relatively readily, the circuit is divided into a DC section and a high frequency section and these sections are connected with the electric source wires only, and a control section is provided in the DC electric source section to reduce the manufacturing cost relatively.

BRIEF DESCRIPTION OF THE DRAWINGS

A more complete appreciation of the invention and many of the attendant advantages thereof will be readily obtained as the same becomes better understood by reference to the following detailed description when taken in connection with the accompanying drawings wherein.

DETAILED DESCRIPTION OF THE PREFERRED EMBODIMENTS

Figure 3:
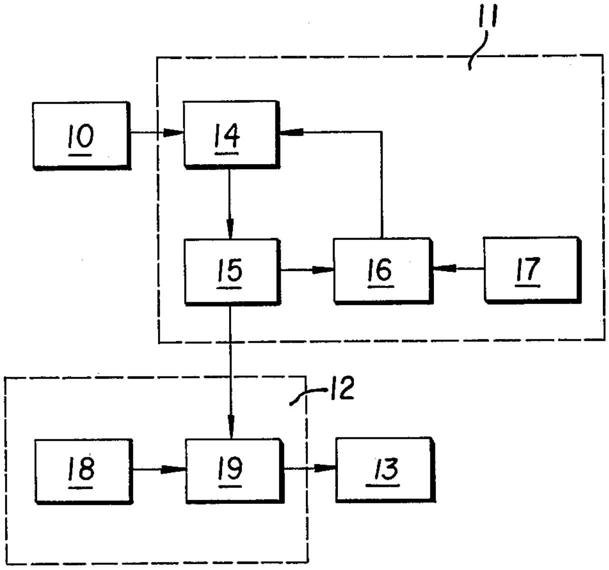
FIG. 3 is a block diagram showing the principle of this invention.

Referring now to the drawings, FIG. 3 is a diagram showing the theoretical arrangement of this invention. In FIG. 3, reference numeral 10 designates a DC electric source; reference numeral 11, a constant current circuit; reference numeral 12, an oscillation circuit; reference numeral 13, a piezoelectric transducer. The constant current circuit 11 is made up of a DC constant current control circuit 14, a current detecting circuit 15, a voltage comparison circuit 16 and a reference voltage generating circuit 17. Current supplied by the DC electric source 10 is applied through the DC constant current control circuit 14 and the current detecting circuit 15 to the load. The current allowed to flow, in this case, is converted into a voltage proportional thereto by the current detecting circuit 15, the voltage being compared with the output voltage of the reference voltage generating circuit 17 by the voltage comparison circuit 16. The voltage comparison circuit 16 outputs the difference voltage to control the DC constant current circuit 14 to make the difference voltage zero, whereupon the output current of the constant current circuit 11 is set to a current value corresponding to the preset output voltage of the reference voltage generating circuit 17. Therefore, the constant current circuit operates to allow a constant current to flow irrespective of the load variation. The oscillation circuit 12 is made up of an oscillation circuit section 18 and a power amplifier circuit 19, or it is a single self-excited oscillation circuit, whose output voltage is substantially in porportion to the electric source voltage. The piezoelectric transducer 13 is formed with a single or a plurality of piezoelectric elements. In the case where liquid is atomized in one form of use of ultrasonic energy, the transducer is a liquid atomizing vibrator which has an atomizing surface at its mechanical output end.

The operation of the circuit thus organized according to the invention will be described. When a predetermined constant current is allowed to flow through the constant current circuit to the oscillation circuit 12 by the DC electric source 10, then the oscillation circuit 12 is operated to oscillate at a frequency equal to or near the resonance frequency of the piezoelectric transducer, so that the oscillation output of the oscillation circuit 12 drives the piezoelectric transducer 13. The mechanical vibration of the piezoelectric transducer 13 causes the transducer 13 to emit ultrasonic energy to perform predetermined work. For instance, in atomizing liquid, the liquid supplied to the atomizing surface of the transducer is suitably atomized. If, under this condition, the load to the piezoelectric transducer 13 is increased, for instance, by increasing the supply of liquid, then the resistance component R of the electrical equivalent circuit as viewed from the input terminal of the piezoelectric transducer 13 is increased. In this case, the output current of the constant current circuit 11 is detected by the current detecting circuit 15, and a voltage proportional thereto is compared with the reference voltage outputted by the reference voltage generating circuit 17 in the voltage comparison circuit 16 and the DC constancurrent control circuit 14 is controlled so that the difference voltage between the two voltages is made zero. As a result, an output driving the piezoelectric transducer 13 with a substantially constant current is provided. Therefore, the voltage across the piezoelectric transducer is increased, and an input greater than the electric power provided before the load to the piezoelectric transducer, such as for instance the supply of liquid, is increased and is applied to the piezoelectric transducer 13. As a result, the mechanical ultrasonic vibration is increased, and the greater ultrasonic energy is emitted. Thus, the atmomizing ability is increased to achieve the greater work. Accordingly, the trouble that the ultrasonic vibration is stopped, or the atomization is stopped, can be prevented. When the load is decreased, or the supply of liquid is decreased, then the operation opposite to that described above is carried out to decrease the mechanical vibration. Thus, the excessive vibration of the vibration output end, the damage of the piezoelectric transducer caused thereby, and the troubles related thereto can be prevented.

In the circuit according to the invention, the voltage proportional to the output current of the DC electric source is controlled so as to be equal to the reference voltage so that the output of the oscillator is approximately proportional to the electric source voltage and the output current of the DC electric source is maintained constant at all times. Therefore, stable ultrasonic vibration can be obtained with the transducer driven, for stably atomizing liquid for instance. Furthermore, in the circuit thus organized, the DC electric source circuit is connected to the high frequency circuit adapted to drive the piezoelectric transducer with the electric source lead wires only. Therefore, the two circuits can be handled in a separate state. In addition, even if a short-circuit trouble occurs between the high frequency circuit and the piezoelectric transducer, the voltage is never increased since the direct current is under the constant current drive, and accordingly the output power thereof is decreased, as a result of which the electric source side is never damaged completely.

Now, this invention will be described with reference to its preferred embodiments.

Figure 4:
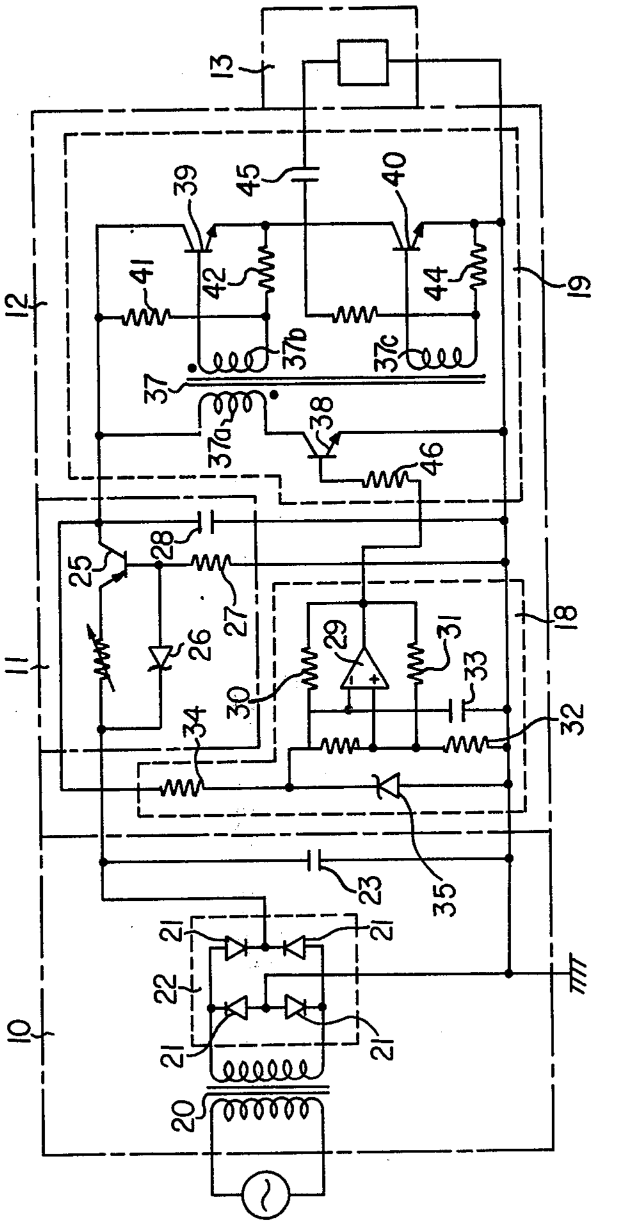
FIG. 4 is a circuit diagram showing a first emodiment of this invention.
Figure 5:
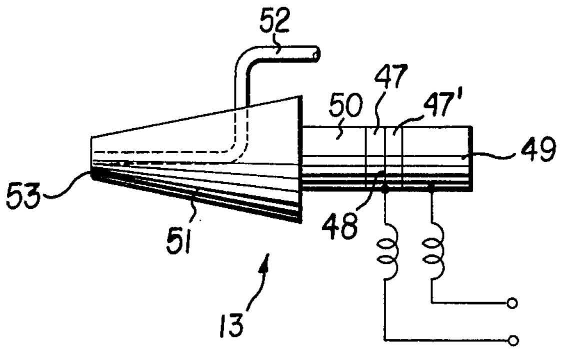
FIG. 5 is a diagram showing the construction of a piezoelectric transducer employed in the first embodiment of the invention.

Shown in FIGS. 4 and 5 is a first embodiment of an electrical circuit for driving a piezoelectric transducer, according to the first aspect of the invention which is adapted to atomize liquid. The circuit comprises an electric source circuit 10 for obtaining direct current from a commercial alternating current, a constant current circuit 11 for providing constant current in a continuous series control system, and an oscillation circuit 12 in a main oscillation electric power amplification system.

The electric source circuit 10 is made up of a power transformer 20, a rectifier circuit 22 having bridge-connected diodes 21, and a smoothing capacitor 23. The AC voltage of the power transformer 20 is subjected to full-wave rectification in the rectifier circuit 22, and ripple components are removed from the output of the rectifier circuit 22 with the aid of the smoothing capacitor. As a result, a DC voltage is provided by the electric source circuit 10.

The constant current circuit 11 is made up of a current detecting resistor 24, a voltage comparator and DC current controlling transistor 25 as an electrical active element, a Zener diode 26, a bias resistor 27, and a smoothing and high-frequency bypassing capacitor 28. The output of the electric source circuit 10 is connected to the current detecting resistor 24 and to the cathode of the Zener diode 26. The other terminal of the resistor 24 is connected to the emitter of a PNP transistor 25, the collector of which is connected to a power terminal of the oscillation circuit 12 which is the load of this circuit 11. The power terminal is connected through the capacitor 28 to the ground. In the constant current circuit thus organized, the current flowing through the output terminal of the electric source circuit 10 is supplied mainly through the current detecting resistor 24 and the transistor 25 to the load. This load current develops a voltage proportional thereto across the resistor 24. The sum of the voltage across the resistor 24 and the emitter-base voltage of the transistor 25 is maintained constant by the characteristic of the Zener diode 26. If the Zener voltage is selected to be much higher than the base-emitter voltage, then the voltage across the resistor 24 becomes substantially equal to the Zener voltage. Since this value is constant, the current in the resistor 24 is substantially constant. As a larger part of this current flows in the load, the circuit 11 operates as a constant current circuit. The current value can be set to a desired value by varying the resistance of the resistor 24.

The oscillation circuit 12 operates in the main oscillation electric power amplification system, and is made up of an oscillation circuit section 18 and a power amplifier circuit 19. The oscillation circuit section 18 is an astable multivibrator circuit to generate a square wave, and it is made up of an operational amplifier 29, resistors 30 through 32 and capacitor 33 for determining an oscillation frequency, an electric source stabilizing resistor 34 and a Zener diode 35 for operating the operational amplifier 29 on a single electric source, and a resistor 36 connected between the connection point of the resistor 34 and the Zener diode 35 and the non-inverting input terminal of the operational amplifier 29. The power amplifier circuit 19 operates to receive the output square wave of the oscillation circuit section 18 and to subject it to power amplification. This circuit 19 comprises an input transformer 37, a driving NPN transistor 38, output transistors 39 and 40, bias resistors 41 through 44, and a DC-blocking capacitor 45. The emitter of the transistor 38 is grounded, and the based thereof is connected through a resistor 46 to the outout terminal of the operational amplifier 29. The collector of the transistor 38 is connected to one end of the primary winding 37*a* of the input transformer 37 (this terminal side being referred to as "a plus polarity"). The other end of the primary winding (this terminal side being referred to as "a minus polarity") is connected to the electric source, that is, the output of the constant current circuit 11. The plus side of a first secondary winding 37*b* of the transformer 37 is connected to the base of the transistor 39, and the minus side thereof is connected to the connection point of the bias resistors 41 and 42 which are series-connected between the electric source and the emitter of the transistor 39. The minus side of a second secondary winding 37*c* is connected to the base of the transistor 40, and the plus side thereof is connected to the connection point of the resistors 43 and 44 which are series-connected between the collector and the emitter of the transistor 40. The collector of the transistor 39 is connected to the electric source, and the emitter thereof is connected to the collector of the transistor 40 and to one terminal of the capacitor 45. The emitter of the transistor 40 is grounded. The circuit 19 thus organized is called a "SEPP circuit". If the operations of the output transistors 39 and 40 are set on class "D" (switching operation), then upon application of the square wave output from the oscillation circuit section 18, the output transistors 39 and 40 rendered conductive alternately so that electrical energy is applied from the electric source to a piezoelectric transducer 13, as a result of which a high frequency power can be supplied to the transducer 13. In this operation, as the output transistors make the class "D" operation, the output voltage thereof is substantialy fully varied between the electric source voltage and the ground potential, whereby the output voltage is approximately proportional to the electric source voltage.

As shown in FIG. 5, the transducer 13 comprises an electrode 48 interposed between two piezoelectric elements 47 and 47' which are electromechanical transducer elements. A backing block 49 for resonance is stuck on the piezoelectric element 47', while a conical amplitude amplifying horn 51 is stuck through a metal block 50 on the piezoelectric element 47. A liquid supplying passage 52 communicating with a liquid supply source (not shown) is formed in the horn 51. The passge 52 is open in the small end surface of the horn 51, namely, an atomizing surface.

In the transducer thus constructed, electrical energy applied to the piezoelectric elements 47 and 47' is converted into mechanical vibration, whereby the transducer resonates, as one unit, at a preset resonance frequency. An electrical equivalent circuit as viewed at the input terminal of the transducer at a frequency in the vicinity of this natural resonance frequency is similar to that shown in FIG. 1. The amplitude of the mechanical vibration obtained by the piezoelectric elements 47 and 47' is maximum at the atomizing surface of the vibration output end of the horn 51 owing to the amplitude amplifying action of the horn 31. Thus, amplitude enough to atomize liquid can be obtained.

Figure 1:
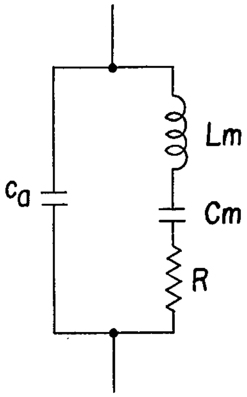
FIG. 1 is a circuit diagram showing an equivalent circuit of a piezoelectric transducer.

It is assumed in the circuit organized as described above that: all the circuits operate in steady state; the oscillation circuit section 18 oscillates at a frequency equal to or near the natural frequency of the transducer 13; the output thereof is amplified by the power amplifier circuit 19 and is converted into mechanical vibration by the piezoelectric elements 47 and 47' of the transducer 13; the amplitude of the mechanical vibration is amplified by the horn 51 into an amplitude enough to atomize liquid with the atomizing surface of the vibration output end; and a certain amount of liquid is supplied through a liquid supplying inlet 52 and is atomized at the atomizing surface. If, under this condition, the amount of liquid thus supplied is increased, the load of the transducer 13 is increased, and the resistance component R in the equivalent circuit shown in FIG. 1 is increased. On the other hand, while the output voltage of the power amplifier circuit 19 swings fully approximately up to the electric source voltage, the constant current circuit 11 changes the electric source voltage in such a manner that a constant current value is maintained independently of the variation of load. Therefore, the output voltage dependent on this electric source voltage is changed and the current driving the transducer 13 becomes substantially constant, and the voltage across the terminals thereof is increased. As a result, electric energy greater than that before the load is increased is inputted, whereby the decrement of the amplitude of the atomizing surface 53 at the top end the horn due to the increment of the load can be prevented. If the liquid supplying quantity is decreased, then the load of the atomizing surface at the top end of the horn 51 is decreased, as a result of which the resistance R in FIG. 1 is decreased, and operation opposite to the operation described above is carried out.

As is clear from the above description, in this embodiment, the continuous series type constant current circuit 11 relatively simple in construction is employed to stabilize atomization. In order to absorb the load variation of the constant current circuit 11 and the voltage variation of the electric source circuit 10, it is necessary to consume the energy corresponding to these variations at all times. Therefore, the efficiency of the embodiment is low, but the circuitry is very simple. Accordingly, the embodiment is suitable for driving a transducer for a short period of time which, like a conventional transducer, is very low in efficiency, that is, which transducer is low in quality factor (Q) and needs high power.

Figure 6:
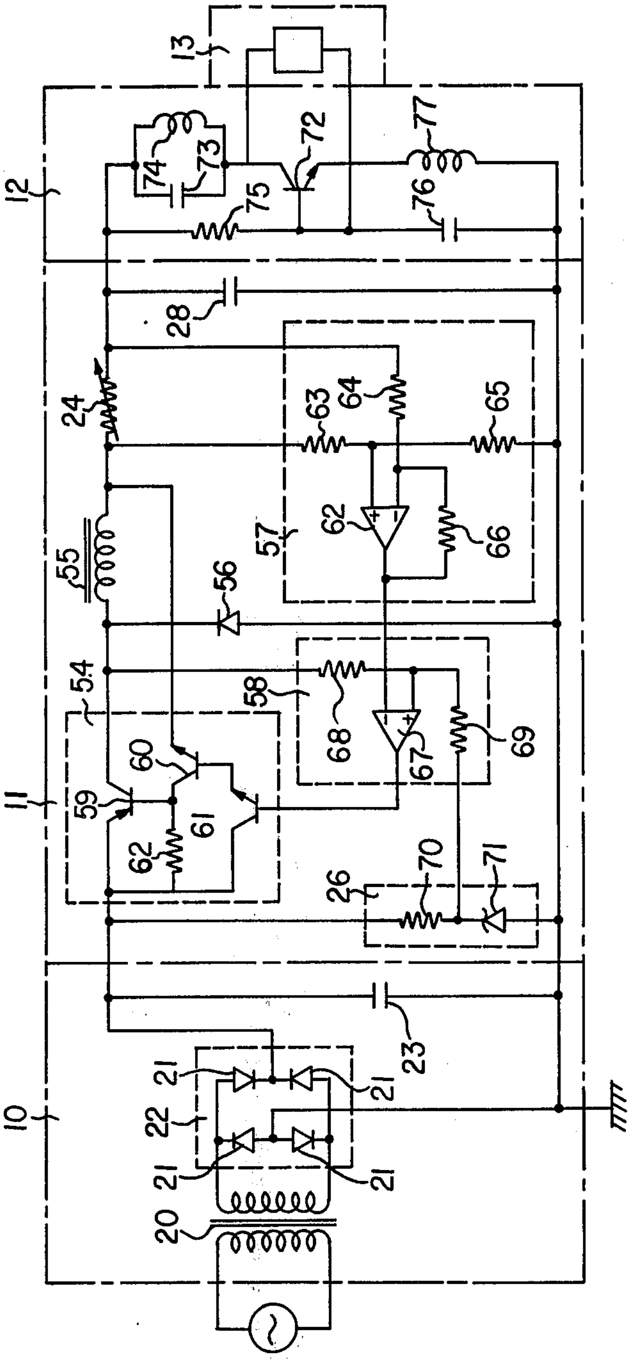
FIG. 6 is a circuit diagram showing a second embodiment of the invention.

FIG. 6 shows a second embodiment of the electrical circuit for driving a piezoelectric transducer according to the second aspect of the invention. In this embodiment, commercial AC power is employed, and after it is converted into direct current, a constant current is provided in a self-excited switching control system as the electric source of a Colpitts type self-excited oscillation circuit, thereby to apply electrical energy to an ultrasonic piezoelectric transducer.

This circuit comprises: an electric source circuit 10 for providing DC power from AC power; a constant current circuit 11 for providing a constant current; an oscillation circuit 12 for supplying a high-frequency power; and a piezoelectric transducer 13 which is a part of the oscillation circuit and outputs an ultrasonic wave.

The electric source circuit 10 is made up of a power transformer 20, a rectifier circuit 22, and a smoothing capacitor 23. The AC voltage of the power transformer 20 is subjected to full wave rectification in the rectifier circuit 22 consists of bridge-connected diodes 21, as a result of which a DC voltage is developed across the smoothing capacitor 23 adapted to remove ripple components. The constant current circuit 11 is a switching control type circuit, which operates to supply a constant current to the oscillation circuit 12, which is the load circuit of the constant current circuit 11, with the aid of the output of the electric source circuit 10. In order to effectively perform this operation, a switching circuit 54 for controlling the on-off operation of the circuit, a coil 55 for storing the electrical energy supplied by the switching circuit 54, and a current detecting resistor 24 for detecting the flow of current are series-connected between the electric source circuit 10 and the oscillation circuit 12. The circuit 11 further comprises: a diode 56 connected between the ground and the connection point of the switching circuit 54 and the coil 55, for discharging the energy which is stored in the coil 55 during the "off" period of the switching circuit 54; a differential amplifier circuit 57 for outputting the voltage developed across the resistor 24; a reference voltage generating circuit 26 connected between the output terminal of the electric source circuit 10 and the ground; a comparator circuit 58 for comparing the output of the reference voltage generating circuit 26 with the output of the differential amplifier circuit 57 and for applying the comparison result to the switching circuit 54; and a capacitor 28 for removing ripple components from the output voltage and for bypassng high frequency current.

In the switching circuit 54, the emitter of a transistor 59 and the collector of a transistor 61 are connected to the output terminal of the electric source circuit 10. The collector of a transistor 60 is connected through a resistor 62 to the output terminal of the electric source circuit 10. The base of the transistor 59 is connected to the collector of the resistor 60, the base of which is connected to the emitter of the transistor 61. The collector of the transistor 59 is connected to one end of the coil 55, the other end of which is connected to the emitter of the transistor 60. The base of the transistor 61 is connected to the output terminal of the comparator circuit 58. In the differential amplifier circuit 57, the non-inverting input terminal and the inverting input terminal of an operational amplifier OP are connected through resistors 63 and 64 to both terminals of the current detecting resistor 24, respectively. The non-inverting terminal is grounded through a resistor 65. A resistor 66 is connected between the inverting input terminal and the output terminal. In the comparator circuit 58, the non-inverting input terminal of an operational amplifier 67 is connected through a resistor 68 to the output terminal of the switching circuit 54 and is further connected through a resistor 69 to the connection point of a stabilizing resistor 70 and a Zener diode 71 in the reference voltage generating circuit 26. The inverting input terminal of the operational amplifier 67 is connected to the output terminal of the differential amplifier circuit 57.

The operation of the constant current circuit will be described. When the switching circuit 54 is closed, the current is allowed to flow from the electric source circuit 10 through the coil 55 and the resistor 24 to the oscillation circuit 12 which is the load of the circuit 11.

As a result, electrical energy is stored in the coil 55, and a voltage proportional to the current applied to the oscillation circuit 12 is developed across the resistor 24. As the current flowing in the resistor 24 is increased with time because of the inductance of the coil 55, the voltage across the resistor 24 is also increased. This voltage is amplified into a suitable voltage by the operational amplifier 62 in the differential amplifier circuit 57, the suitable voltage being applied to the inverting input terminal of the operational amplifier 67 in the comparator circuit 58. In this comparator circuit 58, the output of the reference voltage generating circuit 26 is applied to the non-inverting input terminal thereof through the resistor 69 adapted to provide a hysteresis function for the comparator, and the reference voltage is compared with the output of the differential amplifier circuit 57, that is, the voltage value proportional to the current which flows through the resistor 24. According to this comparison result, the switching circuit 54 is turned on or off. When a period of time passes after the switching circuit has been closed, the output of the differential amplifier circuit 57 becomes greater than the output voltage of the reference voltage generating circuit 26, as a result of which the output of the comparator circuit 58 is set to the ground potential, and the switching circit 54 is placed in the off state. Under this condition, the electrical energy stored in the coil 55 is discharged through the diode 56, so that current is allowed to flow to the oscillation circuit 12 through the resistor 24. This current decreases with time because of the inductance of the coil, that is, the voltage across the resistor 24 decreases. As a result, the output of the differential amplifier circuit 57 decreases. Thus, the output of the differential amplifier circuit 57 becomes less than the output voltage of the reference voltage generating circuit 26, and the output of the comparator circuit 58 increases. Accordingly, the switching circuit is placed in the on state, and the aforementioned state is obtained again.

The switching circuit 54 repeates the on-off operation as described above, and the current is allowed to flow from the electric source circuit 10 in synchronization with this on-off operation so that the electrical energy is cyclically charged in and discharged out of the coil 55. Thus, the current is applied through the resistor 24 to the load, or the oscillation circuit 12. This current is detected at all times to fall in the hysteresis range defined by the resistors 68 and 69 of the comparator circuit 58. Furthermore, with respect to the average value of the current, a necessary load current value can be obtained by varying the resistance of the resistor 24, or it is possible to obtain a constant current output having a variation width.

The oscillation circuit 12 is a relatively simple Colpitts type self-excited oscillation circuit which operates to apply to the transducer 13 high frequency power having a frequency substantially equal to the natural frequency of the transducer 13. In the circuitry formed by the oscillation circuit 12 and the transducer 13, the transducer 13 is a piezoelectric transducer for ultrasonic atomization which is the load of the oscillation circuit 12 and determines the oscillation condition. The transducer 13 is connected between the collector and base of a transistor 72 which is used as a grounded emitter circuit. A capacitor 73 and an inductance 74 determining the oscillation condition are connected between the collector of the transistor 72 and the output terminal of the constant current circuit 11. A transistor bias resistor 75 is connected between the base of the transistor 72 and the output terminal of the constant current circuit 11. An oscillating capacitor 76 and an inductance 77 for improving the efficiency are connected between the base and the emitter of the transistor 72. The connection point of the capacitor 76 and the inductance 77 is grounded. For the oscillation condition of the oscillation circuit 12 and the transducer 13, it is necessary that the reactance between the base of the transistor 72 and ground, and the reactance between the collector of the transistor 72 and the constant current circuit 11 be capacitive, respectively, and that the reactance between the base and the collector of the transistor 72, i.e., the reactance of the transducer 13 be inductive. The parallel circuit of the capacitor 73 and the inductance 74 connected to the collector of the transistor 72 should be so designed that the absolute value of the reactance of the capacitor 73 is smaller than the absolute value of the reactance of the inductance 74 at a frequency near the natural frequency of the transducer 13, that is, it is capacitive at the frequency.

Figure 7:
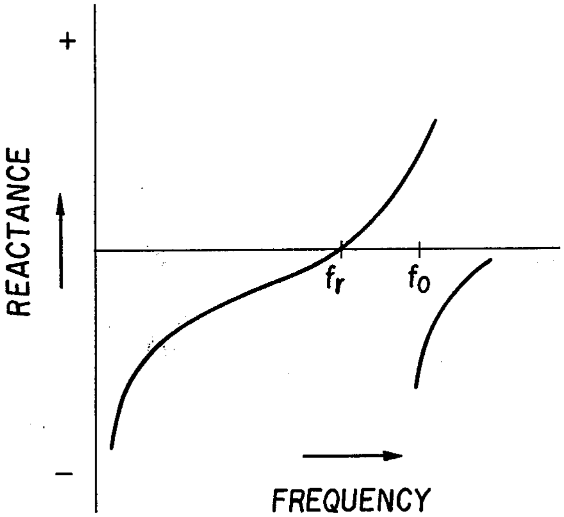
FIG. 7 is a diagram indicating the relation between the frequency of the equivalent circuit in FIG. 1 and the reactance thereof.
Figure 2:
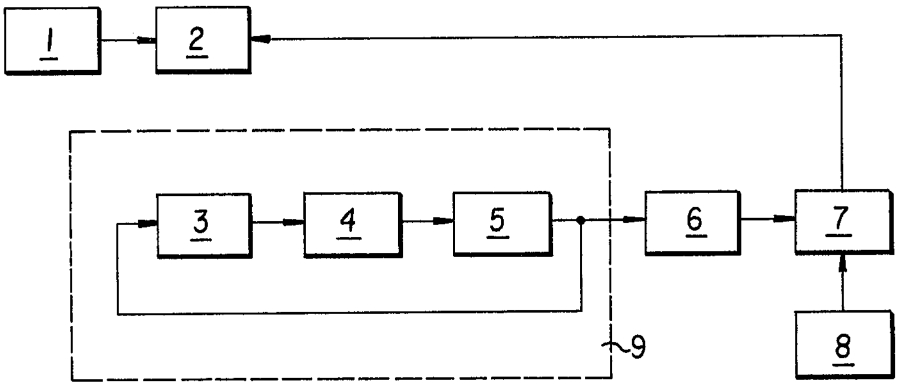
FIG. 2 PRIOR ART
FIG. 2 is a block diagram showing a conventional device.

The relation between the frequency of the electrical equivalent circuit shown in FIG. 1 and the reactance is as indicated in FIG. 7, in which $f_o$ is the natural resonance frequency or the series resonance frequency, and $f_r$ is the parallel resonance frequency. As is clear from FIG. 7, the reactance is positive, or inductive, in a narrow frequency range defined by $f_o$ and $f_r$. In the case where the transistor 72 is used as a grounded-emitter circuit as shown in FIG. 6, three conditions are satisfied: at the frequencies between the natural resonance frequency $f_o$ and the parallel resonance frequency $f_r$ of the transducer 13, the parallel circuit consisting of the capacitor 73 and the inductance 74 connected between the collector of the transistor 72 and the electric source is capacitive; the transducer 13 connected between the collector and the base is inductive; and the capacitor 76 connected between the base and the ground is capacitive. If a transistor having a suitable amplification factor is employed as the transistor 72, the oscillation circuit 12, satisfying the oscillation condition of the Colpitts type self-excited oscillation circuit, oscillates.

The amplitude of the oscillation voltage having the frequency thus oscillated is increased. However, the amplification factor of the transistor 72 is non-linear, and therefore as the amplitude is increased the amplification degree is decreased and is balanced with a certain amplitude, whereby steady state is obtained. The non-linearity in amplification factor of the transistor 72 depends on a transistor employed. However, in the case where the amplification factor is sufficiently large, the operation of the transistor is substantially in the switching mode, and the non-linearity in amplification factor is suppressed by the electric source voltage rather than the amplification factor of the transistor 72, as a result of which the apparent amplification factor is decreased, and under this condition the steady state is obtained. The electrical energy thus provided is consumed by the resistance component in the equivalent circuit shown in FIG. 1. That is, the transducer is formed as one necessary element of this oscillation circuit, and in addition it is used as a means for providing the desired mechanical vibration output.

Figure 8:
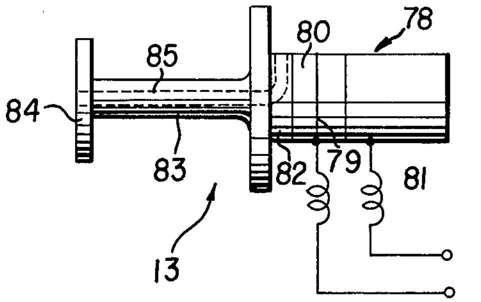
FIG. 8 is a diagram showing the construction of a piezoelectric transducer employed in the second embodiment of the invention.

FIG. 8 shows the transducer used in the oscillation circuit of the second embodiment of the electrical circuit for driving a piezoelectric transducer according to the invention. This transducer is fundamentally similar to that shown in FIG. 5. The transducer 78 has an electrode 79 interposed between two piezoeletric elements 80 and 80′. A backing block 81 for resonance is stuck in one of the piezoelectric elements, and the other piezoelectric element is stuck on a metal block 82 which is in turn stuck on the supporting flange of a stepped horn 83 for amplifying amplitude. A large disk 84 for a large amount of atomization is connected to the atomizing surface which is the mechanical output end of the horn 83. A liquid supplying passage 85 is formed along the axis of the horn 83 in such a manner that it opens at the center of the disk 84.

When electrical energy is applied from the oscillator 12 to the transducer 78 thus constructed, it is converted into mechanical vertical vibration by the piezoelectric elements 80, 80′, and the vibration amplitude is amplified by the horn 83 with the natural resonance frequency of the entire system, as a result of which a vibration amplitude sufficient to vibrate the disk 84 for atomization can be obtained.

It is assumed that the circuit in the second embodiment thus organized operates in the steady state. That is, when commercial AC power is converted into DC power by the electrical source circuit 10, and the predetermined DC current is obtained from the DC power in the constant current circuit 11 and is then applied to the oscillation circuit 12, the oscillation circuit 12 oscillates in the steady state. As a result, electrical energy having a frequency near the natural resonance frequency of the transducer 13 as shown in FIG. 7 is applied to the transducer 13, so that it is converted into mechanical energy by the piezoelectric elements 80, 80′ of the transducer 13. Therefore, if, in the case where the disk-shaped vibrator 84 is vibrating with a certain amplitude, a suitable quantity of liquid is supplied through the liquid supplying inlet 85, the liquid is atomized by the disk-shaped vibrator 84. If the liquid supply quantity is increased, then the value of the resistance component R of the equivalent circuit shown in FIG. 1 is incresed as viewed at the electrical input terminals of the piezoelectric elements 80, 80′ of the transducer 13. However, since the transducer 13 is a part of the oscillation circuit 12, and it is the output of the oscillation circuit as well, and since the electrical energy which is supplied to the transducer 13 is substantially determined by the electric source voltage as described before, the constant current circuit 11 operates to permit the constant current to flow irrespective of the variation of the load connected to the circuit 11, and the voltage between the electric source of the oscillation circuit 12 and ground is increased. Accordingly, the voltage between the terminals of the transducer 13 dependent on this voltage is increased and the greater electrical energy is applied to the transducer. Thus, the ampliture of the disk-shaped vibrator 84 never becomes smaller than the amplitude provided before the liquid supply quantity is increased, and it is increased in atomizing efficiency, thus dealing with the liquid supply quantity. In other words, as the liquid supply quantity is increased, the input of the transducer 13 is increased and the atomizing efficiency is also increased. Thus, the difficulty that the atomization is stopped can be prevented; that is, the atomization can be stably carried out. The second embodiment is of the switching control type. Accordingly, in the second embodiment unlike the first embodiment of the continuous series control type, the voltage drop between the electric source of the constant current circuit and the output thereof is not consumed by the active elements in the circuit, and therefore the energy (Driving power) loss is less. As the constant current circuit 11 is completely separated from the oscillation circuit 12 except for the electric source lines, these circuits can be individually designed. Therefore, the second embodiment is advantageous similarly as in the first embodiment in that the constant current circuit 11 is durable against the breaking of the oscillation circuit 12 and the transducer 13. Furthermore, the second embodiment is advantageous in that, even under the conditions of the high quality factor "Q" of the transducer, varied temperatures and a long drive, oscillation is effected at a frequency near the natural resonance frequency of the transducer, whereby the operation is stable.

Figure 9:
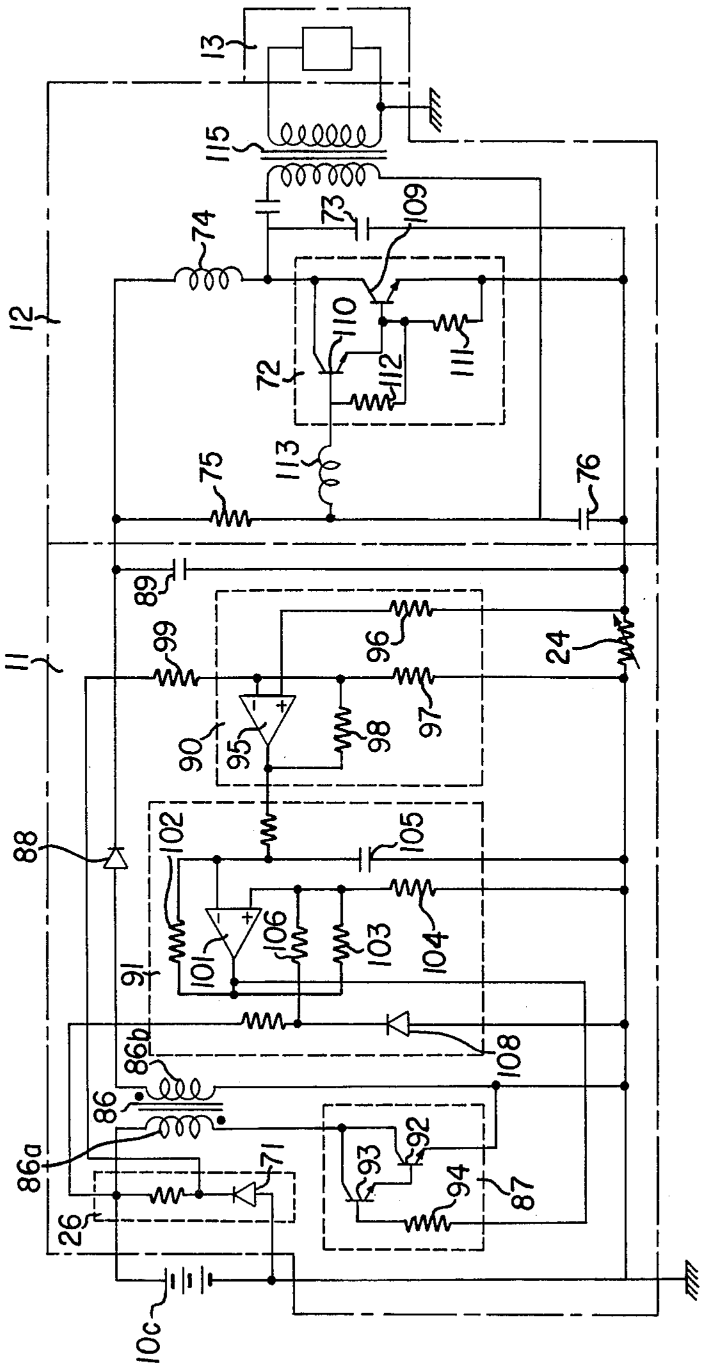
FIG. 9 is a circuit diagram showing a third embodiment of the invention.

FIG. 9 shows a third embodiment of the electrical circuit for driving a piezoelectric transducer according to the second aspect of the invention, in which the electric source is a battery, and energy can be effectively and stably supplied to an ultrasonic atomization piezoelectric transducer. The electrical circuit comprises a battery 10*c*, a constant current circuit 11, an oscillation circuit 12, and a piezoelectric transducer 13.

In the constant current circuit 11, the electrical energy from the battery 10c is converted into a suitable constant current, which is applied to the load thereof, namely, the oscillation circuit 12. The constant current circuit 11 comprises: a flyback transformer 86; a switching circuit 87 for supplying energy from the battery 10c; a diode 88 for rectifying the output of the flyback transformer 86; a smoothing and high-frequency bypassing capacitor 89; a current detecting resistor 24; a voltage comparison circuit, or a differential amplifier 90, for amplifying the difference between the voltage across the resistor 24 and the output voltage of a reference voltage generating circuit 26; and a variable pulse width generating circuit 91 for receiving the output of the differential amplifier 90 to drive the switching circuit 87.

The connection and operation of the various circuit elements in the constant current circuit will be described. The positive terminal of the battery 10*c* is connected to one end of the primary winding 86*a* of the flyback transformer 86, the other end of which is connected to the collector of a transistor 92 in the switching circuit 87 which comprises the transistor 92 and a transistor 93 which are Darlington-connected, and a resistor 94. The emitter of the transistor 92 is grounded. One end of the secondary winding 86*b*, being equal in polarity to the end of the primary winding 86*a* connected to the battery 10*c*, of the flyback transformer 86 is grounded. The other end of the secondary winding is connected through the rectifying diode 88 to the oscillation circuit 12 which is the load of the constant current circuit 11. The smoothing and high-frequency bypassing capacitor 89 is connected between the output terminal of the constant current circuit and ground. The current which has been applied through the rectifying diode 88 to the load is converted into a voltage across the resistor 24. This voltage is applied to the non-inverting input terminal of the differential amplifier 90 made up of an operational amplifier 95 and resistors 96 through 98. As the output of the reference voltage generating circuit 26 made up of a stabilizing resistor 70 and a Zener diode 71 is applied to the inverting inpt terminal of the amplifier, the difference voltage between the voltage propertional to the current which is allowed to flow in the load and the reference voltage is provided at the output of the differential amplifier 90.

The variable pulse width generating circuit 91 is an astable multivibrator which comprises an operational amplifier 101, resistors 102 through 104, a capacitor 105, and a bias electric source including resistors 106 and 107 and a Zener diode 108 for operating the operational amplifier 101 on a single electric source. The circuit 91 outputs a pulse having a time width proportional to the difference voltage between the voltage proportional to the current flowing in the load and the reference voltage. The operation of the variable pulse width generating circuit 91 will be described. When the output of the differential amplifier 90 is applied through a resistor 100 to the inverting input terminal of the operational amplifier 101 and the voltage across the capacitor 105 determining frequency, or timing, is therefore changed, the output pulse width of the operational amplifier 101 is changed. This pulse is applied to the switching circuit 87, so that the switching circuit 87 is rendered conductive or non-conductive according to the pulse width. As a result of this on-off operation of the switching circuit 87, the electrical energy applied to the primary winding of the flyback transformer 86 is transmitted to the secondary winding, and the quantity of energy is determined from the rate at which the switching circuit is closed during one period of the generated pulse.

When the switching circuit 87 is turned on and off with a certain pulse width by the variable pulse width generating circuit 91, current is allowed to flow into the load through the diode 88, and therefore current proportional to the aforementioned current is allowed to flow in the resistor 24. This voltage is compared with the reference voltage provided by the reference voltage generating circuit 26, and the resultant difference voltage is outputted by the differential amplifier 90. When the current in the load is smaller than a preset current value, the output pulse width of the variable pulse width generating circuit 91 is increased, as a result of which the "on" period of the switch circuit 87 is increased, so that the amount of energy transmitted through the flyback transformer 86 is increased and the larger current is applied to the load. When the current in the load is larger than the preset current value, the output pulse width of the variable pulse width generating circuit 91 is decreased. Thus, the constant current is applied to the load. In this connection, the pulse width can be set by varying the resistance of the resistor 24.

The oscillation circuit 12 is based on the same principle as the Colpitts type self-excited oscillation circuit described with reference to FIG. 6; however, it is different in the following points: A Darlington-connected circuit 72' comprising transitors 109 and 110 and resistors 111 and 112 is employed instead of the previously described transistor 72 to improve the amplification factor. An inductance 113 is connected in series to the base of the transistor 72, and a capacitor 73 is connected between the collector and the emitter of the transistor 72, in order to improve the circuit efficiency. A transformer 115 is connected through a DC-blocking capacitor 114 between the collector and the base, for the efficient matching of the transducer 13. The oscillation conditions of this oscillation circuit 12 are completely the same as those of the oscillation circuit 12 in FIG. 6.

Figure 10:
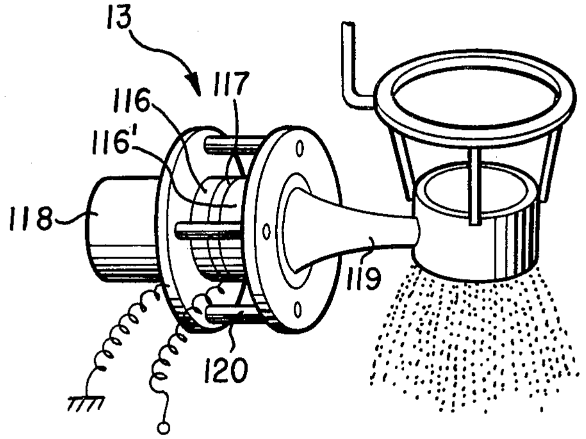
FIG. 10 is a diagram showing the construction of a piezoelectric transducer employed in the third embodiment of the invention.

The transducer 13 used is as shown in FIG. 10. The transducer 13 comprises two disk-shaped piezoelectric elements 116 and 116' coincident in polarity, an electrode 117 interposed between the two piezoelectric elements, a backing block 118, an amplitude amplifying horn 119 secured with four tightening bolts 120, and an annular vibrator 121 coupled to the end of the amplitude amplifying horn 119.

The operation of the transducer 13 will be described. When electrical energy having a suitable frequency and voltage is applied from the abovedescribed oscillation circuit to the piezoelectric elements 116 and 116' between which the electrode 117 is interposed, the electrical energy is converted into mechanical energy by the piezoelectric effect, as a result of which the transducer 13 is vibrated in the thicknesswise direction of the piezoelectric elements 116 and 116'. The backing block 118 and the horn 119 which have been designated so as to resonate with the vibration resonate as one unit. As a result, the annular vibrator 121 is vibrated with a greater amplitude, since the dimensions of the relevant parts are so designed that the amplitude of vibration at the junction surface of the horn 119 and the annular vibrator 121 is greater than the amplitude of the piezoelectric elements 116 and 116'. The annular vibrator 121 is so designed that it vibrates perpendicularly to the cylindrical surface thereof with a resonance frequency equal to the frequency of vibration applied thereto and that it makes a petal-shaped flexural vibration having a plurality of nodes and loops. Thus, the electrical energy applied between the electrode 117 and the ground is converted into ultrasonic vibration. Due to a large area of the inner and outer cylindrical surfaces of the annular vibrator 121, atomization of a large amount of liquid can be effected with sufficient vibration amplitude.

Now, it is assumed that all of the circuits operate in steady state, and that a suitable quantity of liquid is supplied to the annular vibrator 121 of the transducer 13 and is atomized. If, under this condition, the liquid supply quantity is increased, the resistance component R of the transducer 13 is increased, and accordingly the resistance component as viewed from the primary side of the transformer 115 is increased. On the other hand, the constant current circuit 11 operates to convert the electrical energy from the battery 10c into the constant current irrespective to the variation of the load, the constant current being applied to the oscillation circuit. As the high frequency current flowing in the resistance component R depends on the voltage between the terminals of the oscillation circuit 12, this voltage is increased. Thus, energy greater than the energy provided before the liquid supply quantity is increased is supplied thereto, as a result of which the transducer can suitably deal with the increase of the liquid supply quantity. The constant current circuit 11, similarly as in that described with reference to FIG. 6, operates to make the load current constant irrespective of the variation of the input electric source voltage. As the flyback transformer 86 and the matching transformer 115 are employed, a suitable circuit operating point can be determined for improving the entire circuit efficiency by suitably designing the pulse width of the output of the variable pulse width generating circuit 91. Unlike the constant current circuit shown in FIG. 4, this constant current circuit 11 is so designed as not to consume the excessive energy necessary to absorb the load variation component and the DC voltage component at all times but to discharge the energy stored once. Therefore, theoretically, the constant current circuit 11 can carry out control without consuming the energy. Accordingly, in the case where this atomizing device is employed for an automobile, atomization can be effected with high efficiency and suitability even with a battery voltage which is greatly variable, and low. Furthermore, similarly as in the above-described example, the constant current circuit 11 and the oscillation circuit 12 are completely separated except for the electric source connection lines. Therefore, these circuits 11 and 12 can be readily designed, and the constant current circuit 11 is protected from damage which may be caused in association with a failure in the oscillation circuit 12 or the transducer 13. The transducer 13 small in size and capable of atomizing a large amount of liquid in addition to the above-described features, is high in efficiency, that is, it has a very high quality factor "Q". Accordingly, its natural resonance frequency and impedance are greatly varied with temperature and load variation. However, the transducer can be driven at a frequency equal to or near the natural resonance frequency at all times by employing the above-described self-excited oscillation circuit. In addition, with respect to the variation of impedance, a large amount of liquid can be stably atomized by applying an approximately constant current to the transducer.

In the above-described first, second and third embodiments, instead of the constant current circuit 11, a parallel type constant current circuit in which a current control circuit is provided in parallel to the electric source may be employed for the oscillation circuit 12 which is the load of the constant current circuit. Although it is difficult to make the operating point variable, the same constant current characteristic can be obtained approximately and the same effect can be obtained even by using a constant current diode as an electrical active element or a resistor having a positive temperature characteristic as an electrical passive element instead of the constant current circuit 11.

Figure 11:
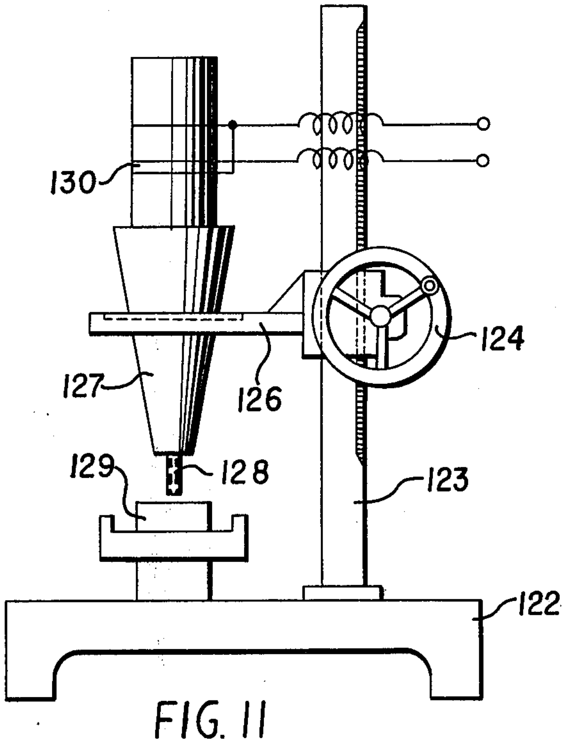
FIG. 11 is a diagram showing another application of the invention.

In each of the above-described embodiments, the invention is applied to the liquid atomizing device; however, it should be noted that the invention is not limited thereto or thereby. For instance, the invention can be applied to the electrical circuit for driving a piezoelectric transducer in a machining device or the like in which a machining tool is coupled to the end of the horn as shown in FIG. 11, so that a work piece is machined by the ultrasonic vibration of the machining tool.

This will be described in more detail. A supporting member 126 is slidably mounted by means of a rotatable handle 124 on a post 123 embedded in the stand 122 of a machining device. A drilling tool 128 is coupled to the end of a conical type horn 127 whose node is held by the supporting member 126, so as to drill a work piece 129 fixedly secured to the stand 122 by the use of the ultrasonic vibration of the drilling tool. In the case where, with the device thus constructed, the piezoelectric element 130 integral with the horn 127 is driven by the electrical circuit for driving a piezoelectric transducer according to the invention, power is applied to the piezoelectric element according to the load, because a constant current is supplied irrespective of the variation of load even if the load applied to the machining tool is varied because of the non-uniform material of the work piece 129. Thus, the difficulties that the work piece cannot be machined or it is excessively machined can be avoided; that is, the work piece can be uniformly machined.

As is apparent from the above description, according to this invention, the constant current circuit and the oscillation circuit are employed to subject the piezoelectric transducer to constant current drive in an approximation mode. Accordingly, the electric source or the constant current circuit will never be damaged by the short-circuit of the transducer or the like. Furthermore, as the circuit is divided into the DC part and the high-frequency part, the circuit design and the experiment can be achieved relatively readily. This is another merit of the invention.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electrical circuit for driving a piezoelectric transducer comprising:
- a DC electric source,
- a constant current circuit connected to said DC electric source for processing a DC signal from said DC electric source and supplying a constant output current having a predetermined constant value, said constant current circuit being comprised of a current detecting circuit for detecting current flowing from said DC electric source to said piezoelectric transducer, a reference voltage generating circuit for generating a reference voltage, a voltage comparison circuit for comparing an output voltage of said current detection circuit with said reference voltage and a DC constant current control circuit for controlling the output current to a predetermined constant value by supplying an output voltage having a voltage value in response to an output signal of said voltage comparison circuit and supplying a constant output current, and
- an oscillation circuit connected to said constant current circuit for driving said piezoelectric transducer with a resonance frequency and a constant current,
- thereby approximately driving said piezoelectric transducer with a constant current by supplying said constant current to said oscillation circuit.

2. An electrical circuit for driving a piezoelectric transducer according to claim 1, wherein:
- said constant current circuit comprises an electrical active element having predetermined electrical active characteristics,
- thereby supplying said constant output current by utilizing said predetermined electrical active characteristics of said electrical active element.

3. An electric circuit for driving a piezoelectric transducer according to claim 1, wherein:
- said constant current circuit comprises an electrical passive element having predetermined electrical passive characteristics,
- thereby supplying said constant output current by utilizing said predetermined electrical passive characteristics of said electrical passive element.

4. An electrical circuit for driving a piezoelectric transducer according to claim 2, wherein:
- said electrical active element of said constant current circuit comprises a transistor.

5. An electrical circuit for driving a piezoelectric transducer according to claim 4, wherein:
- said electrical active element of said constant current circuit comprises a constant current diode.

6. An electrical circuit for driving a piezoelectric transducer according to claim 3, wherein:

said electrical passive element of said constant current circuit comprises a resistor having a positive temperature characteristic.

7. An electrical circuit for driving a piezoelectric transducer according to claim 4, wherein said constant current circuit comprises:

a variable resistor connected to said DC electric source,

A PNP transistor connected to said variable resistor at an emitter terminal thereof, a Zener diode connected between said DC electric source and a base terminal of said PNP transistor, a bias resistor connected between said base terminal of said PNP transistor and the ground, and a capacitor connected between a collector terminal of said PNP transistor and the ground.

8. An electrical circuit for driving a piezoelectric transducer according to claim 7, wherein said DC electric source comprises:

an AC electric source, a power transformer connected to said AC electric source, a rectifier circuit having four bridge-connected diodes connected to said power transformer, and a smoothing capacitor connected between an output terminal of said rectifier circuit and ground.

9. An electrical circuit for driving a piezoelectric transducer according to claim 8, wherein said oscillation circuit comprises:

an oscillation circuit section comprising an astable multivibrator including an operational amplifier, a first resistor connected between an output terminal and a minus input terminal of said operational amplifier, a second resistor connected between an output terminal and a plus input terminal of said operational amplifier, a capacitor connected between said minus input terminal of said operational amplifier and ground, a third resistor connected between said plus input terminal of said operational amplifier and ground, a fourth resistor connected to said plus input terminal of said operational amplifier at one end, a Zener diode connected between the other end of said fourth resistor and ground, a fifth resistor connected between the other end of said fourth resistor and a collector terminal of said PNP transistor of said constant current circuit, and a power amplifier circuit including an input transformer having a primary winding connected to said collector terminal of said PNP transistor of said constant current circuit, and first and second secondary windings, a driving NPN transistor connected to said primary winding of said input transformer and to said operational amplifier of said astable multivibrator through a resistor, a first bias resistor connected between said collector terminal of said PNP transistor of said constant current circuit and one end of said first secondary winding of said input transformer, a first output transistor connected to said collector terminal of said PNP transistor of said constant current circuit at a collector terminal thereof, to the other end of said first secondary winding of said input transformer at a base terminal thereof, and to said one end of said first secondary winding of said input transformer through a resistor at an emitter terminal thereof, a second bias resistor connected between said emitter terminal of said first output transistor and one end of said secondary winding of said input transformer, a second output transistor connected to said emitter terminal of said first output transistor at a collector terminal thereof, to the other end of said second secondary winding of said input transformer at a base terminal thereof, and to said one end of said second secondary winding of said input transformer through a resistor at an emitter terminal thereof connected to ground, and a DC-blocking capacitor connected to said emitter terminal of said first output transistor and to said piezoelectric transducer connected to the ground.

10. An electrical circuit for driving a piezoelectric transducer according to claim 1, wherein:

said current detecting circuit of said constant current circuit comprises a resistor, said reference voltage generating circuit of said constant current circuit comprises a resistor connected at one end thereof to an output terminal of said DC electric source, and a Zener diode connected between the other end of said resistor and the ground, a differential amplifier circuit comprises an operational amplifier, having a resistor connected between an output terminal and a minus input terminal thereof, connected to one end of said resistor of said current detecting circuit through an input resistor at a plus input terminal and to the other end of said resistor of said current detecting circuit through an input resistor at said minus input terminal, said voltage comparison circuit of said constant current circuit comprises a comparator circuit comprising an operational amplifier connected to said output terminal of said operational amplifier of said differential amplifier circuit at a minus input terminal thereof and connected to a connecting point of said resistor and Zener diode of said reference voltage generating circuit through a first input resistor and to a circuit between said current detecting circuit and said output terminal of said DC electric source through a second input resistor, said DC constant current control circuit comprises a switching circuit comprising a first transistor connected to said output terminal of said DC electric source at an emitter terminal thereof, a second transistor connected to a base terminal of said first transistor and to said output terminal of said DC electric source through a resistor at a collector terminal thereof, a third transistor connected to said output terminal of said DC electric source at a collector terminal thereof, connected to a base of said second transistor, and connected to said output terminal of said voltage comparison circuit at a base terminal thereof, and a coil connected to a collector of said first transistor of said switching circuit at one end thereof and connected to an emitter of said second transistor of said switching circuit and said one end of said resistor of said current detecting circuit, a diode connected between said one end of said coil and the ground, and a capacitor connected between the other end of said resistor of said current detecting circuit and the ground.

11. An electrical circuit for driving a piezoelectric transducer according to claim 10, wherein said DC electric source comprises:

an AC electric source, a power transformer connected to said AC electric source, a rectifier circuit having four bridge-connected diodes connected to said power transformer, and a smoothing capacitor connected between an output terminal of said rectifier circuit and ground.

12. An electrical circuit for driving a piezoelectric transducer according to claim 11, wherein said oscillation circuit comprises a Colpitts type self-excited oscillation circuit comprising:

a parallel circuit including a capacitor and an inductance, respectively connected in parallel and connected to an output terminal of said constant current circuit, for determining the oscillation condition, a transistor connected to an output terminal of said parallel circuit and said piezoelectric transducer at a collector terminal thereof, and connected to said piezoelectric circuit at a base terminal thereof, a bias resistor connected between said output terminal of said constant current circuit and said base terminal of said transistor, a capacitor connected between said base terminal of said transistor and the ground, and an inductance connected between an emitter terminal of said transistor and the ground.

13. An electrical circuit for driving a piezoelectric transducer according to claim 1, wherein:

said current detecting circuit of said constant current comprises a resistor, said reference voltage generating circuit of said constant current circuit comprises a resistor connected to an output terminal of said DC electric source at one end thereof, and a Zener diode connected between the other end of said resistor and the ground, said voltage comparison circuit of said constant current circuit comprises a voltage comparator circuit comprising an operational amplifier, having a resistor connected between an output terminal and a minus input terminal thereof, connected to one end of said current detecting circuit through a first input resistor at a plus input terminal thereof, and connected to a connecting point of said resistor and Zener diode of said reference voltage generating circuit through a resistor and to the other end of said current detecting circuit through a second input resistor at said plus input terminal thereof, said DC constant current control circuit comprises a variable pulse width generating circuit comprising an operational amplifier having a first resistor connected between an output terminal and a minus input terminal thereof and a second resistor connected between an output terminal and a plus input terminal thereof, said minus input terminal of said operational amplifier connected to said output terminal of said voltage comparison circuit through a resistor and to ground through a capacitor, said plus input terminal of said operational amplifier connected to a connecting point between a resistor connected to said DC electric source and a diode connected to ground through a resistor and to the ground through a resistor, a switching circuit comprising a first transistor connected to said output terminal of said operational amplifier of said variable pulse width generating circuit through a resistor at a base terminal thereof, and a second transistor connected to an emitter terminal of said first transistor at a base terminal thereof, a flyback transformer comprising a primary winding connected to said output terminal of said DC electric source at one end thereof and connected to collector terminals of said first and second transistors of said switching circuit at the other end thereof, and a secondary winding connected to an emitter terminal of said second transistor of said switching circuit and the ground at one end thereof, and a diode connected to the other end of said flyback transformer, and a capacitor connected between said diode and the other end of said current detecting circuit.

14. An electrical circuit for driving a peizoelectric transducer according to claim 13, wherein:

said DC electric source comprises a battery having a predetermined voltage value.

15. An electrical circuit for driving a piezoelectric transducer according to claim 14, wherein said oscillation circuit comprises:

a resistor connected to said capacitor of said constant current circuit, a first capacitor connected to the other end of said current detecting circuit and said resistor, a first inductance connected to a connecting point of said resistor and first capacitor, a Darlington-connected circuit comprising a first transistor connected to said first inductance at a base terminal thereof, a second transistor connected to an emitter terminal of said first transistor at a base terminal thereof and connected to a collector terminal of said first transistor at a collector terminal thereof, a first resistor connected between said base terminal and emitter terminal of said first transistor, a second resistor connected between said base terminal and emitter terminal of said second transistor, a second inductance connected between said capacitor of said constant current circuit and collector terminals of said first and second transistor of said Darlington-connected circuit, a second capacitor connected between said collector terminals of said first and second transistor and said emitter terminal of said second transistor of said Darlington-connected circuit, a third capacitor connected to said collector terminals of said first and second transistor, and a transformer comprising a first winding connected between said third capacitor and said connecting point of said resistor and first capacitor, and a second winding connected to said piezoelectric transducer and the ground.

* * * * *